(12) United States Patent
Hong et al.

(10) Patent No.: US 7,656,328 B2
(45) Date of Patent: Feb. 2, 2010

(54) SIGNAL LEVEL CONVERSION CIRCUIT FOR INCREASING DYNAMIC RANGE OF ANALOG-TO-DIGITAL CONVERTER

(75) Inventors: Songcheol Hong, Yuseong-gu (KR); Joon Ho Oum, Yuseong-gu (KR)

(73) Assignee: Korea Advanced Institute of Science & Technology, Daejeon (KR)

( * ) Notice: Subject to any disclaimer, the term of this patent is extended or adjusted under 35 U.S.C. 154(b) by 0 days.

(21) Appl. No.: 12/133,129

(22) Filed: Jun. 4, 2008

(65) Prior Publication Data

US 2009/0128390 A1    May 21, 2009

(30) Foreign Application Priority Data

Nov. 15, 2007   (KR) ........................ 10-2007-0116810

(51) Int. Cl.
   *H03M 1/62* (2006.01)
   *H03M 1/84* (2006.01)
(52) U.S. Cl. ........................ 341/139; 144/155
(58) Field of Classification Search ........... 341/155, 341/141, 139
   See application file for complete search history.

(56) References Cited

U.S. PATENT DOCUMENTS

| | | | |
|---|---|---|---|
| 4,748,440 A | * | 5/1988 | Kobayashi ................ 341/158 |
| 5,736,949 A | * | 4/1998 | Ong et al. ................ 341/141 |
| 6,134,430 A | | 10/2000 | Younis et al. |
| 6,504,500 B1 | * | 1/2003 | Tsukamoto ................ 341/155 |
| 7,148,834 B2 | * | 12/2006 | da Fonte Dias ............ 341/162 |

FOREIGN PATENT DOCUMENTS

KR    10-2007-0065368    6/2007

* cited by examiner

*Primary Examiner*—Peguy JeanPierre
(74) *Attorney, Agent, or Firm*—Merchant & Gould P.C.

(57) ABSTRACT

Disclosed herein is a signal level conversion circuit for increasing the dynamic range of an Analog-to-Digital Converter (ADC). A comparison and calculation unit compares the value of an input signal $V_{in}$ and the value of a first reference signal $V_{ref1}$ and compares the value of the input signal $V_{in}$ and the value of a second reference signal $V_{ref2}$, and calculates and outputs respective differences therebetween. A signal leveling circuit unit converts signal levels of the respective output signals of the comparison and calculation unit so that the output signals fall within the dynamic range of an ADC. The ADC digitizes the output signal $V_o$ of the signal leveling circuit unit and the output signals $V_{ack1}$ and $V_{ack2}$ of the comparison and calculation unit.

12 Claims, 5 Drawing Sheets

SIGNAL LEVEL CONVERSION CIRCUIT FOR INCREASING DYNAMIC RANGE OF ANALOG-TO-DIGITAL CONVERTER

BACKGROUND OF THE INVENTION

1. Field of the Invention

The present invention relates generally to a signal level conversion circuit for increasing the dynamic range of an Analog-to-Digital Converter (ADC) without decreasing or modifying resolution, and, more particularly, to a signal level conversion circuit for increasing the dynamic range of an ADC, which enables an ADC having a predetermined dynamic range from $-V_{min}$ to $V_{max}$ to receive signals in the range from $-2V_{min}$ to $2V_{max}$ without changing the resolution of the ADC.

2. Description of the Related Art

A conventional circuit for increasing the dynamic range of an ADC includes two or more ADCs 10, 20, and 30, which have dynamic ranges different from each other, as shown in FIG. 1. In the case in which an input analog signal has an amplitude exceeding the limit level of the ADC 30, the ADCs 10 and 20, which have dynamic ranges wider than that of the ADC 30, are sequentially operated using a selector 40, so that the dynamic range of the ADC is changed depending on the value of the input signal, thereby decreasing the consumption of power.

Although the conventional technique has an advantage in that the consumption of power is decreased using an appropriate ADC depending on the value of a signal, there is a problem in that a plurality of ADCs must be used.

SUMMARY OF THE INVENTION

Accordingly, the present invention has been made keeping in mind the above problems occurring in the prior art, and an object of the present invention is to provide a circuit capable of performing digital conversion on an input signal in a range twice a predetermined input dynamic range without changing the number or resolution of ADCs.

In order to accomplish the above object, the present invention provides a signal level conversion circuit for increasing the dynamic range of an Analog-to-Digital Converter (ADC), including a comparison and calculation unit for comparing the value of an input signal $V_{in}$ and the value of a first reference signal $V_{ref1}$ and comparing the value of the input signal $V_{in}$ and the value of a second reference signal $V_{ref2}$, and calculating and outputting respective differences therebetween; a signal leveling circuit unit for converting the signal levels of the respective output signals of the comparison and calculation unit so that the output signals fall within the dynamic range of an ADC; and the ADC for digitizing the output signal $V_o$ of the signal leveling circuit unit and the output signals $V_{ack1}$ and $V_{ack2}$ of the comparison and calculation unit.

Further, the signal level conversion circuit further includes a signal processing unit for recovering the output signals, digitized by the ADC, to original analog input signals.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Detailed features and other advantages of the present invention will be more clearly understood from the following detailed description taken in conjunction with the accompanying drawings. Further, it should be noted that, in the following description, where it is determined that the detailed descriptions of well-known functions or constructions related to the present invention would obscure the gist of the present invention, they are omitted.

The present invention will be described in detail with reference to the accompanying drawings below.

A signal level conversion circuit for increasing the dynamic range of an ADC according to the present invention will be described with reference to FIGS. 2 to 5, below.

Figure 1:
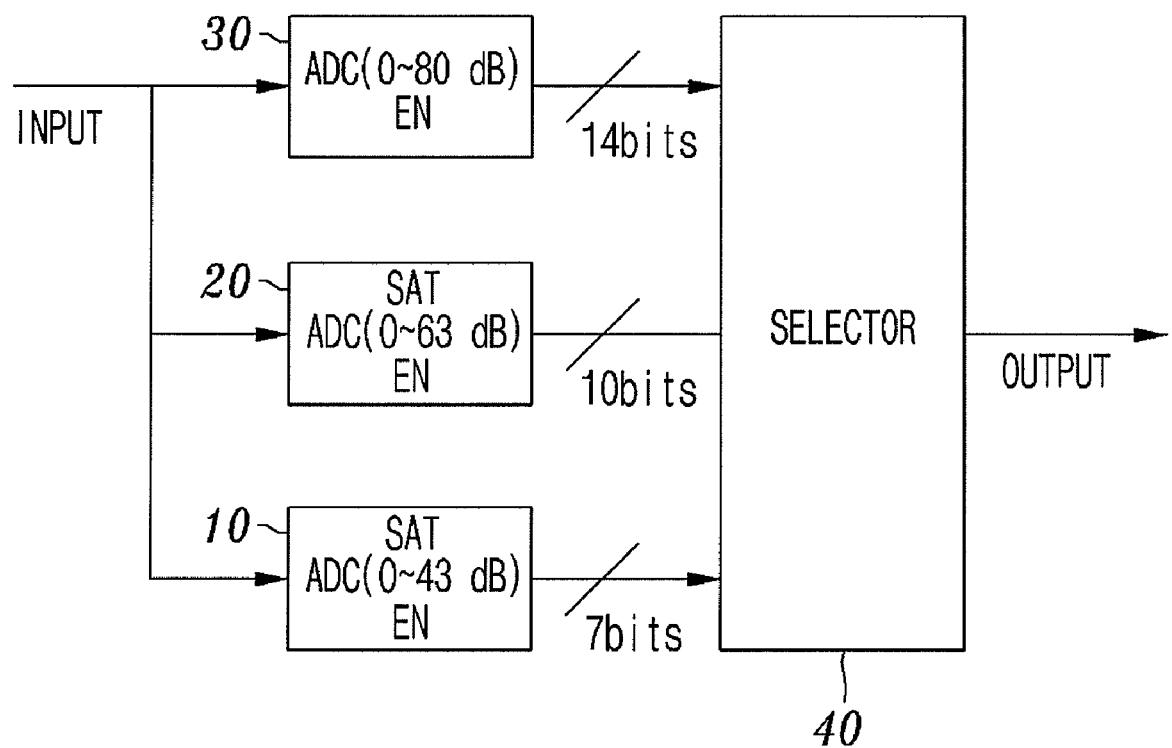
FIG. 1 is a circuit diagram showing an example of a circuit for increasing the input dynamic range of a conventional ADC.
Figure 2:
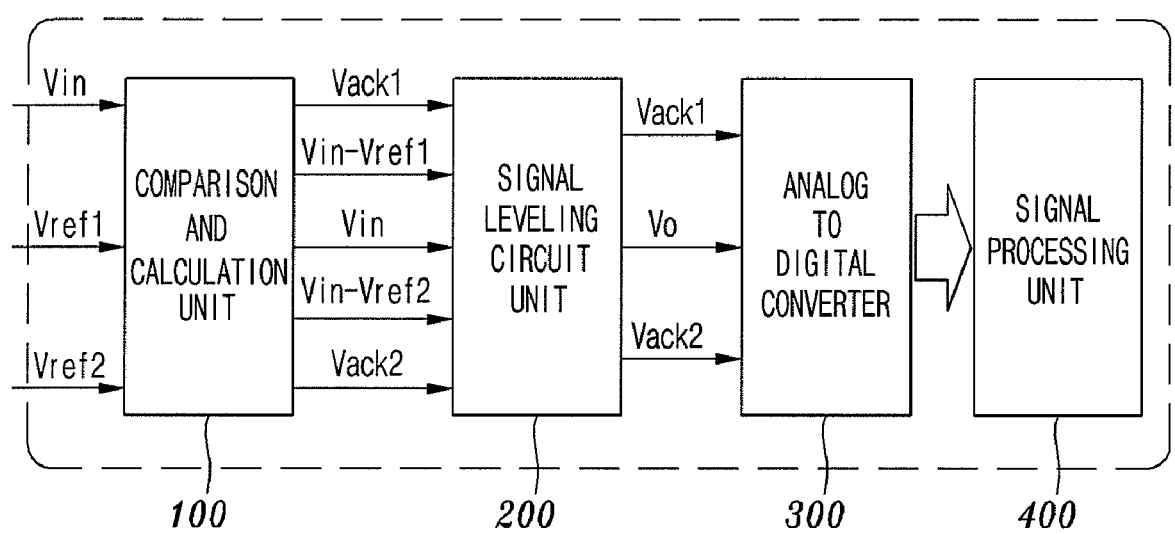
FIG. 2 is a circuit diagram showing the entire configuration of a signal level conversion circuit for increasing the dynamic range of an ADC according to the present invention.

FIG. 2 is a circuit diagram showing the entire configuration of a signal level conversion circuit for increasing the dynamic range of the ADC according to the present invention. The signal level conversion circuit includes a comparison and calculation unit 100, a signal leveling circuit unit 200, an ADC 300, and a signal processing unit 400, as shown in the drawing.

Figure 3:
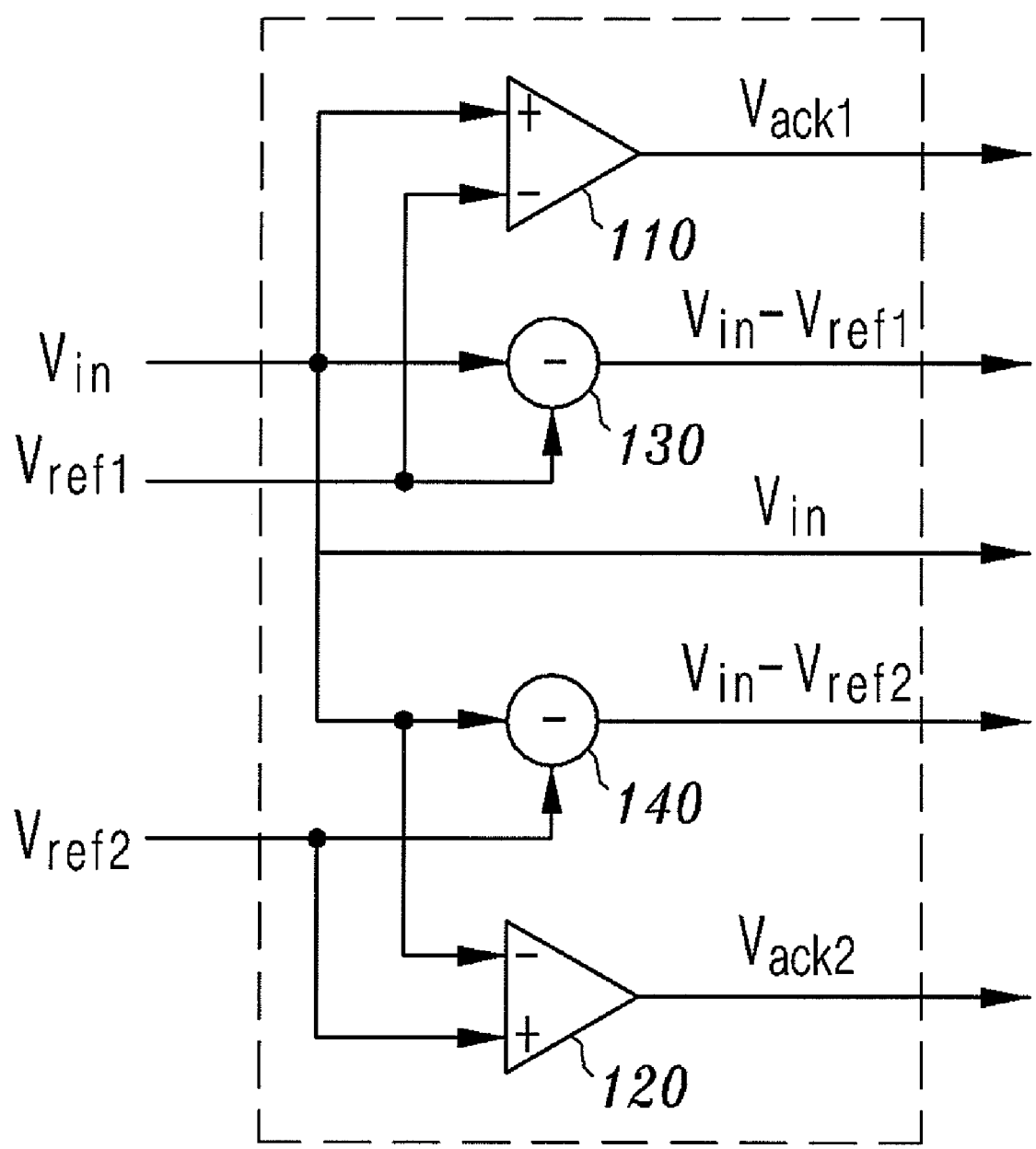
FIG. 3 is a circuit diagram showing an example of a comparison and calculation unit according to the present invention.

FIG. 3 is a circuit diagram showing an example of the comparison and calculation unit 100 according to the present invention. With regard to the detailed configuration thereof, the comparison and calculation unit 100 performs a function of comparing an input signal $V_{in}$ with first and second reference signals $V_{ref1}$ and $V_{ref2}$, which have signs different from each other, and calculates and outputs the difference therebetween. The comparison and calculation unit 100 includes a first comparator 110 for determining whether the value of the input signal $V_{in}$ is greater than the value of the first reference signal $V_{ref1}$, and, in the case in which the value of the input signal $V_{in}$ is greater than the value of the first reference signal $V_{ref1}$, outputting a signal $V_{ack1}$, the value of which is at a high level, a second comparator 120 for, in the case in which the value of the input signal $V_{in}$ is smaller than the value of the second reference signal $V_{ref2}$, outputting a signal $V_{ack2}$, the value of which is at a high level, a first calculator 130 for receiving the input signal $V_{in}$ and the first reference signal $V_{ref1}$, and calculating and outputting a value $V_{in}-V_{ref1}$, which indicates the difference therebetween, and a second calculator 140 for receiving the input signal $V_{in}$ and the second reference signal $V_{ref2}$, and calculating and outputting a value $V_{in}-V_{ref2}$, which indicates the difference therebetween. That is, the comparison and calculation unit 100 outputs the values of the input signal $V_{in}$ and signals $V_{ack1}$, $V_{ack2}$, $V_{in}-V_{ref1}$, and $V_{in}-V_{ref2}$.

Figure 4:
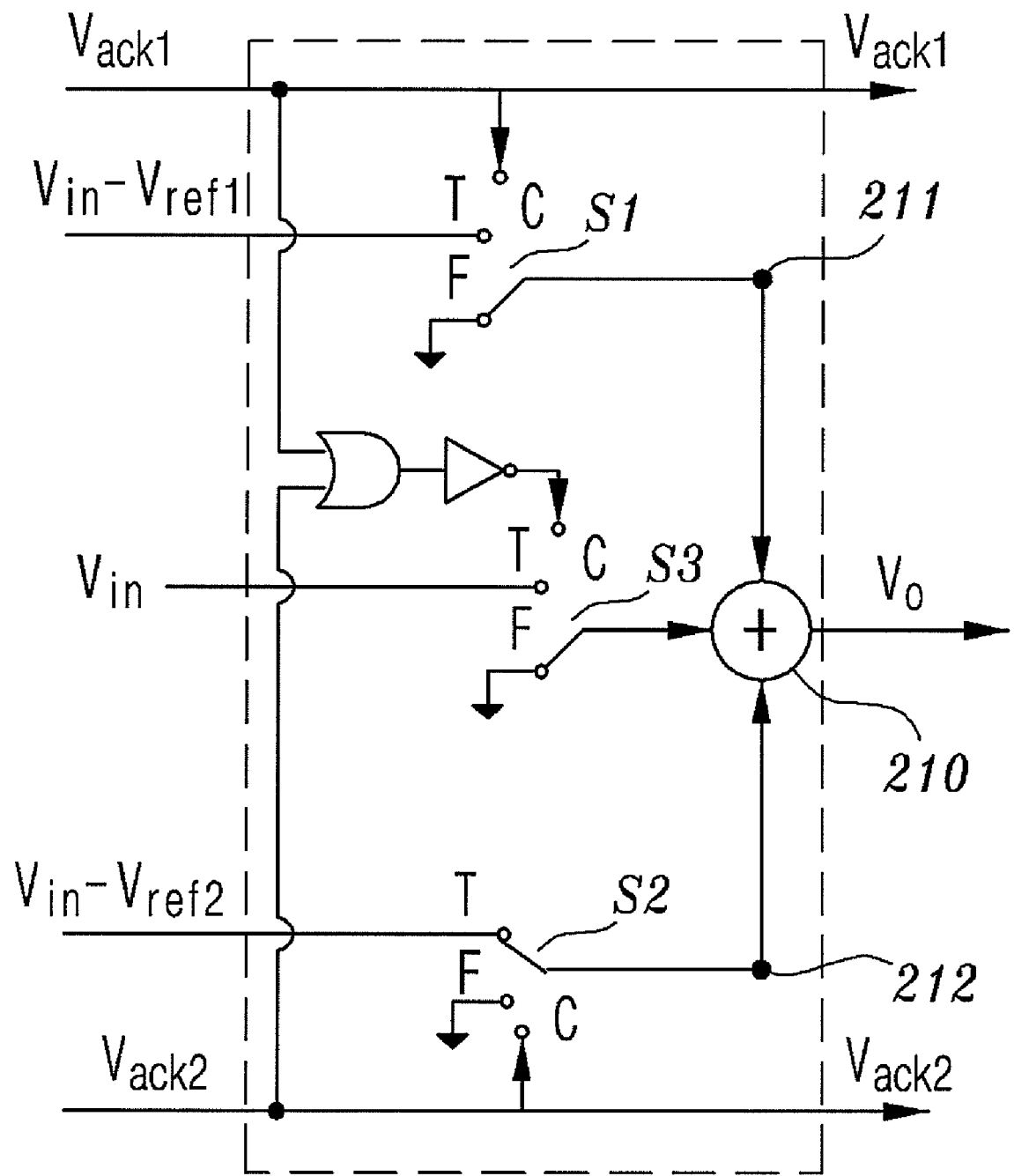
FIG. 4 is a circuit diagram showing an example of a signal leveling circuit unit according to the present invention.

FIG. 4 is a circuit diagram showing an example of the signal leveling circuit unit 200 according to the present invention. With regard to the detailed configuration thereof, the signal leveling circuit unit 200 performs a function of performing conversion on the levels of signals so that analog input signals, input from the comparison and calculation unit 100, fall within the dynamic range of the ADC 300. As shown in FIG. 4, in the case in which the value of the input signal $V_{in}$, input through the comparison and calculation unit 100, is greater than the value of the first reference signal $V_{ref1}$, that is, in the case in which the value of the signal $V_{ack1}$ is at a high level, the contact of a first switch S1 is connected to a node 'T', so that the value of the input terminal 211 of a voltage adder 210 is $V_{in}-V_{ref1}$. In the case in which the value of the input signal $V_{in}$ is smaller than the value of the first reference signal $V_{ref1}$, the contact of the first switch S1 is connected to a node 'F', so that the value of the input terminal 211 of the voltage adder 210 is 0.

Further, in the case in which the value of the input signal $V_{in}$, input through the comparison and calculation unit 100, is smaller than the value of the second reference signal $V_{ref2}$, that is, in the case in which the value of the signal $V_{ref2}$ is at a high level, the contact of a second switch S2 is connected to a node 'T', so that the value of the input terminal 211 of the voltage adder 210 is $V_{in}-V_{ref2}$. In the case in which the value of the input signal $V_{in}$ is greater than the value of the second reference signal $V_{ref2}$, the contact of the switch S2 is connected to a node 'F', so that the value of the input terminal 212 of the voltage adder 210 is 0.

Namely, in the case in which the value of the input signal $V_{in}$ is greater than the value of the first reference signal $V_{ref1}$, the signal leveling circuit unit 200 outputs a signal, the value of which is obtained by subtracting the first reference signal $V_{ref1}$ from the input signal $V_{in}$. In the case in which the value of the input signal $V_{in}$ is smaller than the value of the second reference signal $V_{ref2}$, the signal leveling circuit unit 200 outputs a signal, the value of which is obtained by subtracting the second reference signal $V_{ref2}$ from the input signal $V_{in}$. Further, in the case in which the value of the input signal $V_{in}$ is between the first reference signal $V_{ref1}$ and the second reference signal $V_{ref2}$, the signal leveling circuit unit 200 outputs the original input signal $V_{in}$.

Thereafter, the voltage adder 210 adds the voltage of the input signal $V_{in}$ and the voltages of the two node voltages 211 and 212, and then outputs an output signal $V_o$ as the result of the addition. Here, the output signal $V_o$ has the relationship represented by the following Equation 1.

$$V_o = \begin{cases} V_{in} - V_{ref1} & \text{if } V_{in} \geq V_{ref1} \\ V_{in} & \text{if } V_{ref2} \leq V_{in} \\ V_{in} - V_{ref2} & \text{if } V_{in} \leq V_{ref2} \end{cases} \quad (1)$$

The ADC 300 performs a function of digitizing the signal $V_o$ output from the signal leveling circuit unit 200 and the signals $V_{ack1}$ and $V_{ack2}$ output from the comparison and calculation unit 100.

If the dynamic range of the ADC 300 ranges from $-V_{min}$ to $V_{max}$, $V_{ref1}=V_{max}$, $V_{ref2}=-V_{min}$, and the value of the input signal $V_{in}$ ranges from $-2V_{min}$ to $2V_{max}$, the value of the signal $V_o$ ranges from $-V_{min}$ to $V_{max}$. That is, the value of the signal $V_o$ falls within the dynamic range of the ADC 300, and the signal $V_o$ can be digitized without being saturated. The signal $V_o$, digitized by the ADC 300, is recovered to the signal $V_{in}$ using the relationship represented by the following Equation 2.

$$V_{in} = \begin{cases} V_o + V_{ref1} & \text{if } V_{ack1} \equiv \text{True} \\ V_o & \text{if } V_{ack1} \equiv \text{False and } V_{ack1} \equiv \text{False} \\ V_o + V_{ref2} & \text{if } V_{ack2} \equiv \text{True} \end{cases} \quad (2)$$

The signal processing unit 400 performs a function of recovering the output signal digitized by the ADC 300 to an original analog input signal.

Figure 5:
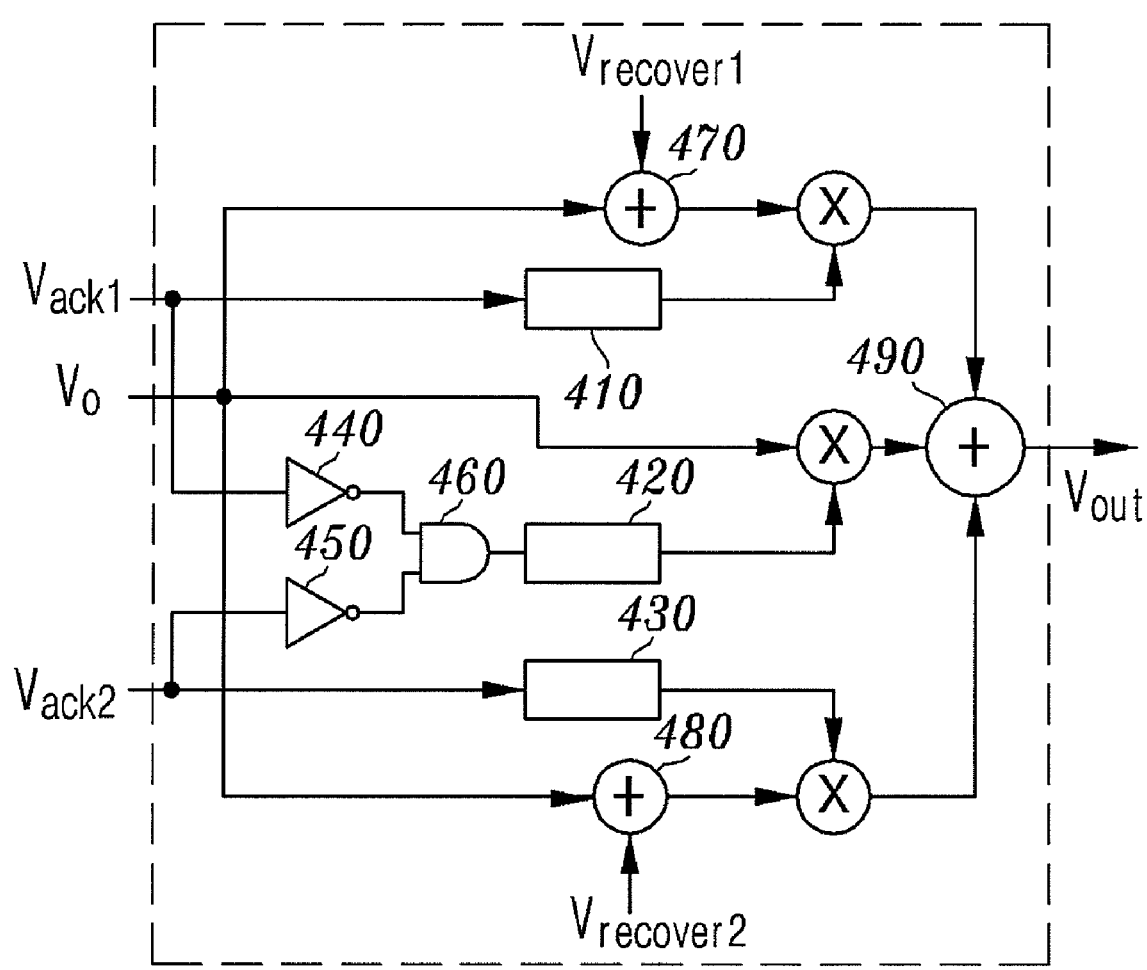
FIG. 5 is a circuit diagram showing an example of a signal processing unit according to the present invention.

In detail, FIG. 5 is a circuit diagram showing an example of the signal processing unit 400 for recovering a digitized output signal to an original analog input signal according to the present invention. As shown in FIG. 5, each of the signals $V_{ack1}$ and $V_{ack2}$ has a value at a low or high level. In the case in which all of the values of the inputs of first, second, and third signal processing blocks 410, 420, and 430 are at high levels, the outputs thereof have the value "1". Further, only in the case in which all of the values of the signals $V_{ack1}$ and $V_{ack2}$ are at low levels, the output of the second signal processing block 420 has the value "1" by logical operators 440, 450, and 460.

Therefore, in the case in which the value of the input signal $V_{in}$ is greater than the value of the first reference signal $V_{ref1}$, a signal, in which the value of a first recovery signal $V_{recover1}$ is added to the value of the signal $V_o$ by an adder 470, is sent to a final adder circuit 490. In the case in which the value of the signal $V_{in}$ is not greater than the value of the first reference signal $V_{ref1}$, the output of the second signal processing block 420 is "0", so that the output of a multiplexing circuit is "0", and this value is sent to the final adder circuit 490.

Further, in the case in which the value of the input signal $V_{in}$ is smaller than the value of the second reference signal $V_{ref2}$, the value of the signal $V_{ack2}$ has a value at a high level, and a signal, in which the value of a second recovery signal $V_{recover2}$ is added to the value of the signal $V_o$ by an adder 480, is sent to a final adder circuit 490 through the multiplexing circuit.

Further, in the case in which the value of the input signal $V_{in}$ is smaller than the value of the first reference signal $V_{ref1}$ and is greater than the value of the second reference signal $V_{ref2}$, the output of the second signal processing block 420 is "1", and the value of the signal $V_o$ is sent to the final adder circuit 490 without change.

Therefore, a final signal $V_{out}$ can be represented by the following Equation 3 using the above-described method of recovering a signal.

$$V_{out} = \begin{cases} V_o + V_{recover1} & \text{if } V_{ack1} \equiv \text{True} \\ V_o & \text{if } V_{ack1} \equiv \text{False and } V_{ack1} \equiv \text{False} \\ V_o + V_{recover2} & \text{if } V_{ack2} \equiv \text{True} \end{cases} \quad (3)$$

Here, in Equation 2 and Equation 3, in the case in which $V_{recover1}=V_{ref1}$ and $V_{recover2}=V_{ref2}$, the value of the signal $V_{out}$ is the same as the value of the signal $V_{in}$ to be digitized.

According to the present invention, there is an advantage in that digital conversion can be performed on an input signal in a range twice a predetermined input dynamic range without changing the number of ADCs and without changing the resolution of the ADCS.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A signal level conversion circuit for increasing a dynamic range of an Analog-to-Digital Converter (ADC), comprising:
a comparison and calculation unit for comparing a value of an input signal $V_{in}$ and a value of a first reference signal $V_{ref1}$ and comparing the value of the input signal $V_{in}$ and a value of a second reference signal $V_{ref2}$, and calculating and outputting respective differences therebetween;
a signal leveling circuit unit for converting signal levels of respective output signals of the comparison and calculation unit so that the output signals fall within a dynamic range of an ADC; and
the ADC for digitizing an output signal $V_0$ of the signal leveling circuit unit and the output signals $V_{ack1}$ and $V_{ack2}$ of the comparison and calculation unit,
wherein $V_{ack1}$ is the output signal of the comparison and calculation unit, and the value of $V_{ack1}$ is at a high level if the value of the input signal $V_{in}$, is greater than the value of the first reference signal $V_{ref1}$ and
wherein $V_{ack2}$ is the output signal of the comparison and calculation unit, and the value of $V_{ack2}$ is at a high level if the value of the second reference signal $V_{ref2}$ is greater than the value of the input signal $V_{in}$.

2. The signal level conversion circuit as set forth in claim 1, further comprising a signal processing unit for recovering the output signals, digitized by the ADC, to original analog input signals.

3. The signal level conversion circuit as set forth in claim 2, wherein the signal processing unit recovers the original input signal $V_{in}$ based on the value of the output signal $V_0$ by adding a value of a first recovery signal $V_{recover1}$ to the value of the output signal $V_0$ digitized by the ADC when the value of the input signal $V_{in}$ is greater than the value of the first reference signal $V_{ref1}$.

4. The signal level conversion circuit as set forth in claim 2, wherein the signal processing unit recovers the original input signal $V_{in}$ based on the value of the output signal $V_0$ by adding a value of a second recovery signal $V_{recover2}$ to the value of the output signal $V_0$ when the value of the input signal $V_{in}$ is smaller than the value of the second reference signal $V_{ref2}$.

5. The signal level conversion circuit as set forth in claim 2, wherein the signal processing unit recovers the original input signal $V_{in}$ based on the value of the output signal $V_0$ by receiving the value of the signal $V_0$ without change when the value of the input signal $V_{in}$ is between the value of the first reference signal $V_{ref1}$ and the value of the second reference signal $V_{ref2}$.

6. The signal level conversion circuit as set forth in claim 1, wherein the comparison and calculation unit comprises:
a first calculator for receiving the value of the input signal $V_{in}$ and the value of the first reference signal $V_{ref1}$, and calculating and outputting a value $V_{in}$-$V_{ref1}$, which is the difference between the received values; and
a second calculator for receiving the value of the input signal $V_{in}$ and the value of the second reference signal $V_{ref2}$, and calculating and outputting a value $V_{in}$-$V_{ref2}$, which is a difference between the received values.

7. The signal level conversion circuit as set forth in claim 6, wherein the comparison and calculation unit comprises:
a first comparator for outputting the signal $V_{ack1}$ having a value at a high level when the value of the input signal $V_{in}$ is greater than the value of the first reference signal $V_{ref1}$; and
a second comparator for outputting the signal $V_{ack2}$ having a value at a high level when the value of the input signal $V_{in}$ is smaller than the value of the second reference signal $V_{ref2}$.

8. The signal level conversion circuit as set forth in claim 1, wherein the signal leveling circuit unit outputs a signal having a value obtained by subtracting the value of the first reference signal $V_{ref1}$ from the value of the input signal $V_{in}$ when the value of the input signal $V_{in}$ is greater than the value of the first reference signal $V_{ref1}$, outputs a signal having a value obtained by subtracting the value of the second reference signal $V_{ref2}$ from the value of the input signal $V_{in}$ when the value of the input signal $V_{in}$ is smaller than the value of the second reference signal $V_{ref2}$, and outputs the original input signal $V_{in}$ when the value of the input signal $V_{in}$ is between the value of the first reference signal $V_{ref1}$ and the value of the second reference signal $V_{ref2}$.

9. The signal level conversion circuit as set forth in claim 1, wherein $|V_{min}| \geq 0$ when the dynamic range of the ADC ranges from $-V_{min}$ to $V_{max}$.

10. The signal level conversion circuit as set forth in claim 1, wherein the first reference signal $V_{ref1}$ is in a range of $0 \leq V_{ref1} \leq V_{max}$ when the dynamic range of the ADC ranges from $-V_{min}$ to $V_{max}$.

11. The signal level conversion circuit as set forth in claim 1, wherein the second reference signal $V_{ref2}$ is in a range of $-V_{min} \leq V_{ref2} \leq 0$ when the dynamic range of the ADC ranges from $-V_{min}$ to $V_{max}$.

12. The signal level conversion circuit as set forth in claim 1, wherein the value of the first reference signal $V_{ref1}$ is identical to the value of the second reference signal $V_{ref2}$ but a sign of the first reference signal $V_{ref1}$ is different from a sign of the second reference signal $V_{ref2}$.

* * * * *